(12) United States Patent
Matsumoto

(10) Patent No.: US 7,147,166 B2
(45) Date of Patent: Dec. 12, 2006

(54) SUBSTRATE TRANSFER APPARATUS, SEMICONDUCTOR MANUFACTURING APPARATUS, AND SEMICONDUCTOR DEVICE MANUFACTURING METHOD

(75) Inventor: Ken Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 223 days.

(21) Appl. No.: 09/920,752

(22) Filed: Aug. 3, 2001

(65) Prior Publication Data

US 2002/0020751 A1    Feb. 21, 2002

(30) Foreign Application Priority Data

Aug. 4, 2000    (JP)    ............... 2000-236359

(51) Int. Cl.
G06K 19/00    (2006.01)
(52) U.S. Cl. .................. 235/487; 235/462.05
(58) Field of Classification Search ........... 235/487, 235/472.02, 462.05; 430/22; 355/97; 250/571; 141/98
See application file for complete search history.

(56) References Cited

U.S. PATENT DOCUMENTS

| | | | |
|---|---|---|---|
| 4,010,355 A * | 3/1977 | Roehrman et al. ...... | 235/462.13 |
| 4,532,970 A | 8/1985 | Tullis et al. ............. | 141/98 |
| 4,534,389 A | 8/1985 | Tullis ..................... | 141/98 |
| 4,616,683 A | 10/1986 | Tullis et al. ............. | 141/98 |
| 4,716,299 A * | 12/1987 | Tanaka et al. ........... | 250/559.01 |
| 4,999,671 A * | 3/1991 | Iizuka .................... | 355/97 |
| 5,822,524 A * | 10/1998 | Chen et al. .............. | 709/203 |
| 5,864,130 A * | 1/1999 | Kahn et al. .............. | 235/462.01 |
| 5,929,978 A * | 7/1999 | Masaki .................... | 355/53 |
| 6,048,655 A * | 4/2000 | Nakahara ................. | 430/22 |
| 6,303,398 B1 * | 10/2001 | Goerigk .................. | 438/14 |
| 6,460,770 B1 * | 10/2002 | Kucharczyk ............. | 235/472.02 |
| 6,597,969 B1 * | 7/2003 | Greenwald et al. ...... | 700/216 |
| 6,618,640 B1 * | 9/2003 | Hittner et al. ........... | 700/116 |

FOREIGN PATENT DOCUMENTS

| | | |
|---|---|---|
| JP | 64-58859 | 3/1989 |
| JP | 5-66733 | 9/1993 |
| JP | 7-66118 | 3/1995 |
| JP | 10-149983 | 6/1998 |
| JP | 11-65093 | 3/1999 |

OTHER PUBLICATIONS

*Abstract for Corresponding Japanese Patent Application Publication No. 60-227437, published Nov. 12, 1985.

* cited by examiner

Primary Examiner—Thien M. Le
Assistant Examiner—Lisa M. Caputo
(74) Attorney, Agent, or Firm—Fitzpatrick, Cella, Harper & Scinto

(57) ABSTRACT

A bar code containing information about a reticle (transparent substrate) is marked on the reticle at a portion vertically overlapping a transfer hand when the reticle held by the transfer hand is transferred. A reflecting portion is formed on the transfer hand at a portion corresponding to the bar code. A bar code reader has an illumination portion and detection portion. When the reticle is held and transferred by the transfer hand, the illumination portion illuminates the bar code, and the detection portion detects light reflected by the reflecting portion to read the bar code. The illumination portion and detection portion of the bar code reader may be separated and disposed to oppose each other through the reticle, thereby reading the bar code in the transmission scheme.

6 Claims, 12 Drawing Sheets

F I G. 5
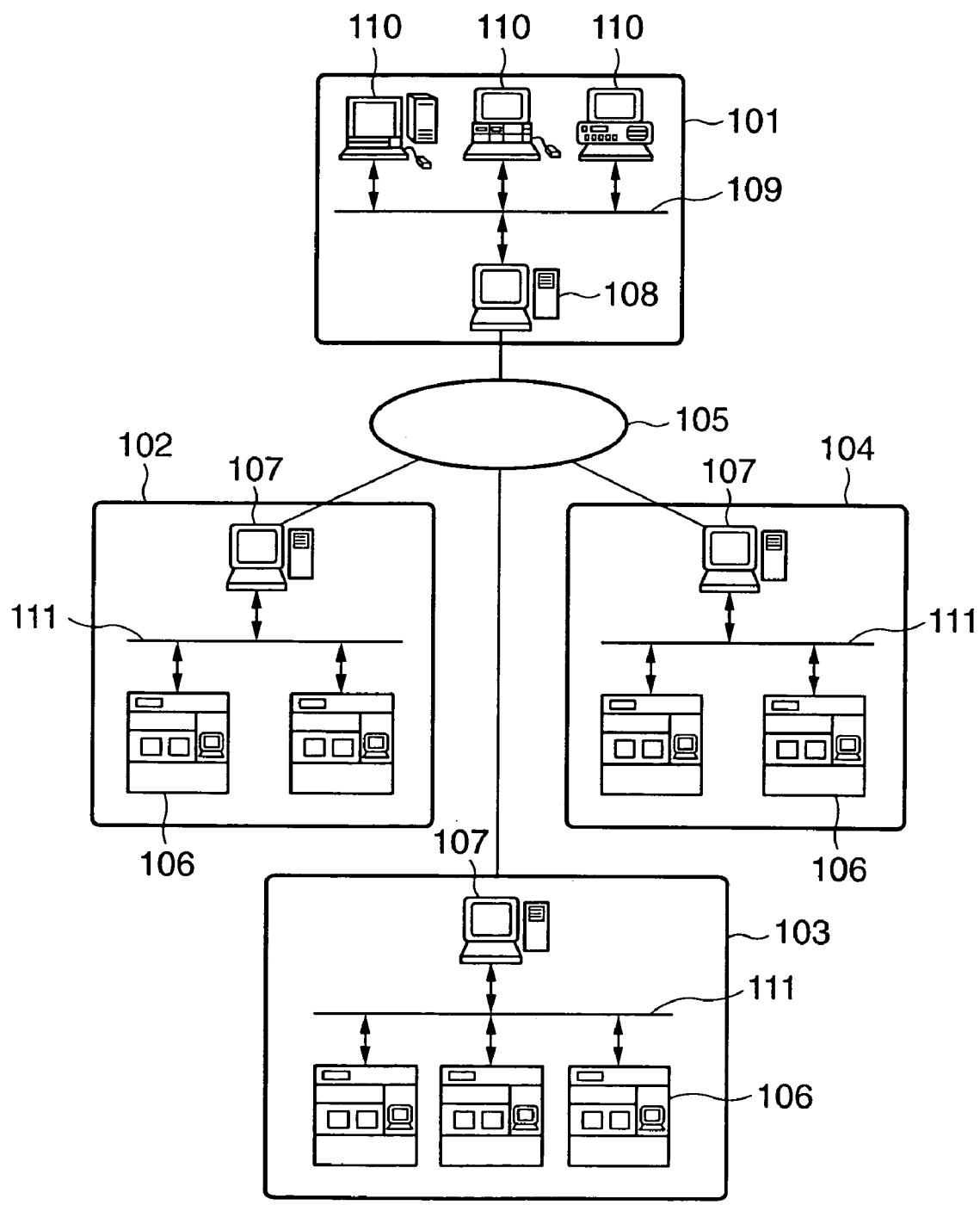

FIG. 7

```
URL  http://www.··········
TROUBLE DB INPUT WINDOW

INPUT
TYPE OF APPARATUS  [**********] ~401
SUBJECT  [OPERATION ERROR (START-UP ERROR)] ~403
SERIAL NUMBER S/N  [465NS·····] ~402
DEGREE OF URGENCY  [D] ~405
SYMPTOM  [LED KEEPS FLICKERING
          AFTER POWER-ON] ~406
REMEDY   [POWER ON AGAIN
          (PRESS RED BUTTON IN ACTIVATION)] ~407
PROGRESS [INTERIM HAS BEEN DONE] ~408

(SEND) (RESET)    410                411              412
LINK TO RESULT LIST DATABASE   SOFTWARE LIBRARY   OPERATION GUIDE
```

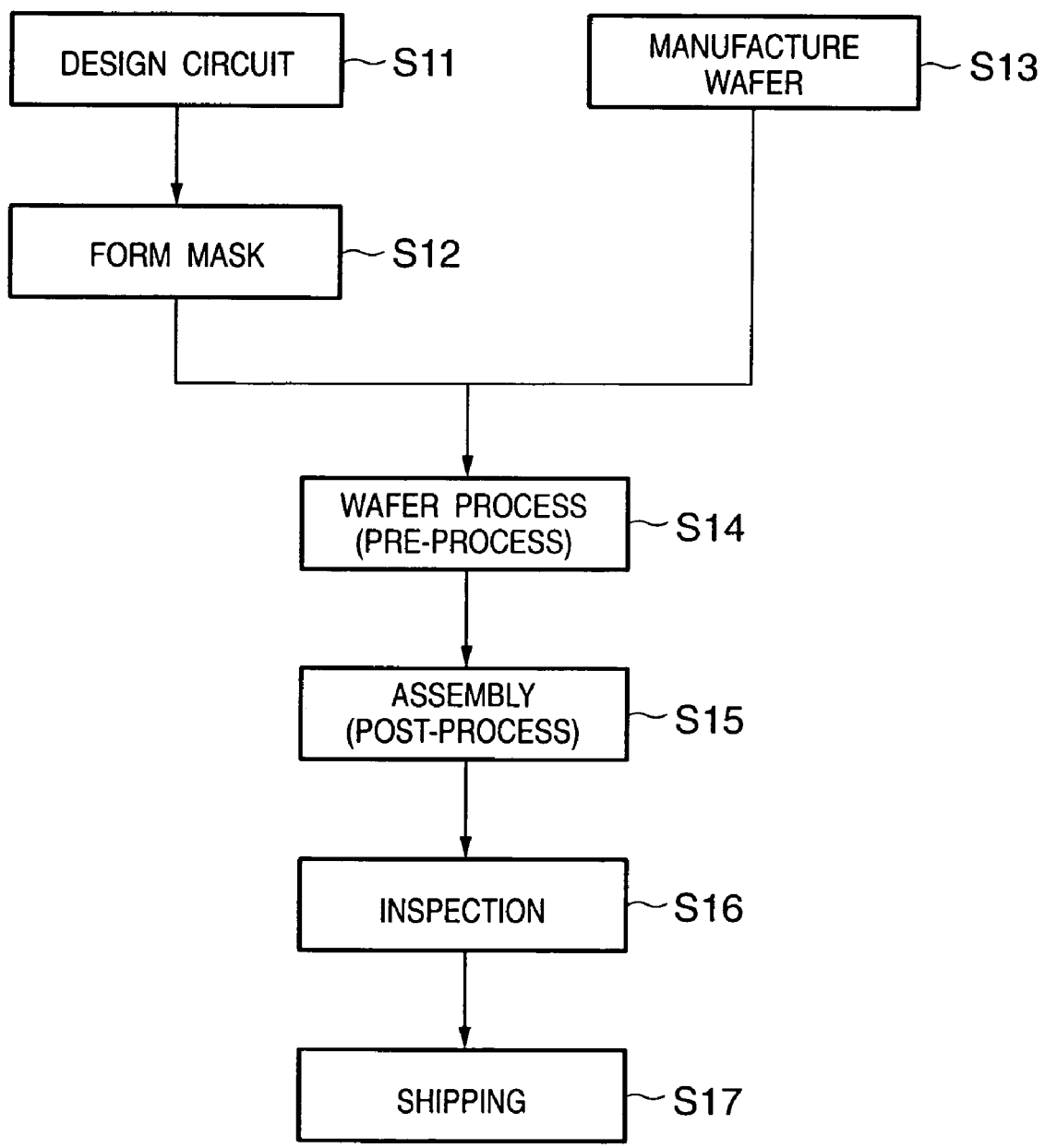

SUBSTRATE TRANSFER APPARATUS, SEMICONDUCTOR MANUFACTURING APPARATUS, AND SEMICONDUCTOR DEVICE MANUFACTURING METHOD

FIELD OF THE INVENTION

The present invention relates to a semiconductor manufacturing apparatus for processing plate-like substrates such as a photomasks, wafers, or glass plates, and a substrate container such as a cassette or carrier, which stores the plate-like substrates. More particularly, the present invention relates to a substrate transfer apparatus for reading a code containing substrate information for identifying a plate-like substrate marked with the code and managing and processing the substrate in order to automate transfer and management of the plate-like substrate or substrate container, a semiconductor manufacturing apparatus, and a semiconductor device manufacturing method.

BACKGROUND OF THE INVENTION

A substrate transfer apparatus for automatically transferring substrates or a substrate container such as a cassette or carrier for storing the substrates in a semiconductor manufacturing apparatus or between semiconductor manufacturing apparatuses has been used to prevent foreign substances from attaching to plate-like substrates such as photomasks, reticles, wafers, or glass plates and to improve productivity.

In such a substrate transfer apparatus, a code having patterned substrate information is marked on a substrate or substrate container which contains substrates for better substrate management and operation in order to accurately identify and quickly feed a substrate such as a reticle required for each manufacturing step. The code is read in a substrate stocker, each step, or each apparatus to register and check the substrate.

To improve the reliability of management of substrates such as reticles, conventionally, a cassette and reticle are paired and managed by collating codes respectively marked on them, as disclosed in Japanese Patent Laid-Open No. 1-58859.

In such an apparatus, the material of a substrate such as a reticle is a transparent glass material, and a pattern used for exposure is formed at the central portion of the reticle. A code about reticle information is marked around this pattern. The pattern and code are made of chromium, and an antireflection film is formed on the surface of the pattern and code so as to prevent any adverse influence on exposure. The pattern and code have a low reflectance. When a general reflection reading method is used, the contrast between the pattern portion of the code and the reticle substrate is low, resulting in unstable reading.

In order to solve this problem, as disclosed in Japanese Patent Laid-Open No. 7-66118 and 10-149983, a transmission type reticle code reading apparatus is used in which a light-emitting portion is separated from a light-receiving portion. In reading the reticle code, a reticle is held on a transfer hand at a dedicated reading position when it is to be transferred from the reticle container to a processing section.

A conventional transmission type bar code reading method will be described with reference to FIGS. 12A and 12B. In FIGS. 12A and 12B, reference numeral 91 denotes a reticle made of a transparent glass material. A pattern portion 91b used for semiconductor exposure, alignment marks 91c used for various alignment operations in exposure and formed in the blank portion of the pattern portion 91b, and a bar code 91a serving as a reticle code are marked on the lower surface of the reticle 91 by using chromium or the like. Reference numeral 92 denotes a transfer hand for extracting the reticle 91 from a reticle carrier and transferring it to the exposure apparatus main body. The transfer hand 92 is horizontally and vertically movable by a driving device (not shown). Suction pads 92b for chucking the reticle by vacuum suction and reticle stoppers 92c for preventing any positional shift of the reticle are disposed on a pair of holding arms 92a of the transfer hand 92, respectively. A bar code reading unit 93 is comprised of an illumination portion 93a for illuminating the bar code on the reticle and a bar code reader 93b incorporating a light-receiving portion for reading the bar code. The bar code 91a of the reticle 91 read by the bar code reader 93b is converted into an electrical signal, which is sent to a terminal and used as a reticle ID to set various parameters in exposing the reticle.

In reading the bar code 91a, the reticle 91 is transferred to the reading position above the bar code reader 93b while being held by the transfer hand 92. At this time, the bar code 91a on the reticle 91 is positioned not to overlap the holding arms 92a of the transfer hand 92, as shown in FIG. 12B. At the reading position, light from the illumination portion 93a is partially shielded by the bar portions of the bar code 91a, which are made of chromium or the like, and forms a shadow on the detection portion of the bar code reader 93a. The space portions of the bar code 91a are the transparent glass portions of the reticle. The illumination light passes through the space portions, so that the bar code is projected on the detection portion of the bar code reader 93b. Therefore, the bar code 91a of the reticle 91 is read.

In recent years, an SMIF (Standardized Mechanical Inter-Face) reticle transfer system has been introduced. The SMIF reticle transfer system will be described below. An increase in foreign substance management level and a recent demand for high working efficiency so as to cope with a next gigabit generation inevitably increases the running cost of the equipment when the state-of-the-art cleaning scheme for cleaning the whole clean room by a downflow is employed. From this viewpoint, local cleaning of a clean space is required to propose the concept of a mini-environment represented by the SMIF, as proposed in Japanese Patent Publication No. 5-66733.

FIG. 10 is a schematic view showing a semiconductor exposure apparatus of a SMIF scheme having already been used in practice. FIGS. 11A to 11D are views illustrating reticle transport states in the SMIF semiconductor exposure apparatus.

The environment of the SMIF semiconductor exposure apparatus is equivalent to that of a chamber 60. The environment is separated from the environment outside the chamber in the clean room. The temperature, pressure, and cleanliness of the environment of the SMIF semiconductor exposure apparatus are managed. A plurality of load ports 61 are disposed on the horizontal portion of the chamber 60. A reticle SMIF pod 50 is placed on the load port 61 to load a reticle into the chamber 60. As shown in FIGS. 11A to 11D, the reticle SMIF pod 50 comprises a reticle carrier library 54 for storing a plurality of reticles 51, a carrier main body 52 and a pod door 53 for closing the lower opening of the carrier main body 52. The reticle SMIF pod 50 is set on the load port door 62 of the load port 61 (see FIG. 11B), and the pod door 53 is then unlocked by an unlocking mechanism incorporated in the load port door 62. As shown in FIG. 11C, the reticle carrier library 54, which stores the plurality of reticles 51, is extracted downward from the carrier main body 52 by an elevator mechanism 63 while the pod door 53 is held integrally with the load port door 62. The reticle carrier library 54 is loaded into the chamber 60. As shown in FIG. 11D, the reticles 51 stored in the reticle carrier library 54 can be loaded or unloaded by a reticle transfer robot 55 in the chamber 60. The reticle transfer robot 55 is comprised of a transfer hand 56 for chucking/holding a reticle, a robot main body 57 for driving the transfer hand 56, and a Z-axis driving unit 58 for vertically driving the robot main body 57.

In this SMIF scheme, assume that while one reticle is used in the apparatus, another reticle stored in the same carrier as the reticle used is to be used in another apparatus. In this case, the carrier is removed from the apparatus used. For this purpose, a reticle library (65 in FIG. 10) for storing a plurality of reticles is arranged to temporarily store the reticle currently used and to improve flexibility in reticle management.

In the conventional example described above, a reticle code is read with transmitted light on the transfer hand. In this case, however, since light does not pass through the holding arm which holds the reticle, no code is marked on a reticle portion vertically overlapping the holding arm. In addition, the reticle code must be formed so as not to interfere with alignment marks and the like. The position of the reticle code is limited, and the capacity of a substrate information code cannot be increased.

In the conventional example described above, when the reticle and cassette are managed in a pair, and the number of types of reticles increases as with ASICs, the number of cassettes increases accordingly to result in complex management. As a method not to manage the cassette and reticle in a pair, Japanese Patent Laid-Open No. 11-65093 discloses a method of directly reading a code on a reticle in a cassette. However, when a plurality of reticles are stored in one carrier as in the SMIF scheme or reticle codes of reticles in a reticle library are to be checked, it is impossible to read the codes marked around the patterns on the surfaces of reticles while the reticles are stored in the carrier because they are vertically stacked on each other at a small interval. In this case, a reticle is temporarily extracted from the reticle carrier and transferred to the dedicated code reading position, thereby reading the code. It takes a long time to read the code, resulting in inconvenience.

SUMMARY OF THE INVENTION

The present invention has been made in consideration of the conventional unsolved problems, and has as its object to provide a substrate transfer apparatus capable of quickly reading the code of a substrate such as a reticle or wafer during transfer or in a stored state, improving the reliability and efficiency of substrate management and a substrate transfer system, and increasing the capacity of a substrate information code on a substrate, thereby increasing the degree of freedom in substrate management and operation, a semiconductor manufacturing apparatus incorporating this substrate transfer apparatus, and a semiconductor device manufacturing method.

According to one aspect of the present invention, the foregoing object is achieved by providing a substrate transfer apparatus comprising transfer means, having a holding member for holding a transparent substrate, for causing the holding member to hold the transparent substrate and transferring the transparent substrate, reading means having first and second parts separated from each other to optically read a pattern formed on the transparent substrate, the first part being built into the transfer means, and control means for moving the holding member so that the first and second parts have a predetermined positional relationship while the transparent substrate is being held, and causing the reading means to read the pattern.

According to one aspect of the present invention, the foregoing object is achieved by providing a semiconductor manufacturing apparatus comprising a substrate transfer apparatus for transferring to an exposure position a reticle obtained by forming an exposure pattern and information pattern on a transparent substrate, and exposure means for exposing a target exposure substrate using the reticle transferred to the exposure position, the substrate transfer apparatus comprising transfer means, having a holding member for holding a transparent substrate, for causing the holding member to hold the transparent substrate and transferring the transparent substrate, reading means having first and second parts separated from each other to optically read a pattern formed on the transparent substrate, the first part being built into the transfer means, and control means for moving the holding member so that the first and second parts have a predetermined positional relationship while the transparent substrate is being held, and making the reading means read the pattern.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 is a schematic view showing an overall arrangement of a semiconductor device production system;

FIG. 7 is a view showing the input window user interface of a trouble database;

FIG. 8 is a flow chart showing a semiconductor device manufacturing process;

DETAILED DESCRIPTION OF THE PREFERRED EMBODIMENTS

Preferred embodiments of the present invention will now be described in detail in accordance with the accompanying drawings.

First Embodiment

As an embodiment of a substrate transfer apparatus according to the present invention, a reticle transfer apparatus incorporated in a semiconductor manufacturing apparatus will be described with reference to FIGS. 1A to 1C.

Figure 1A:
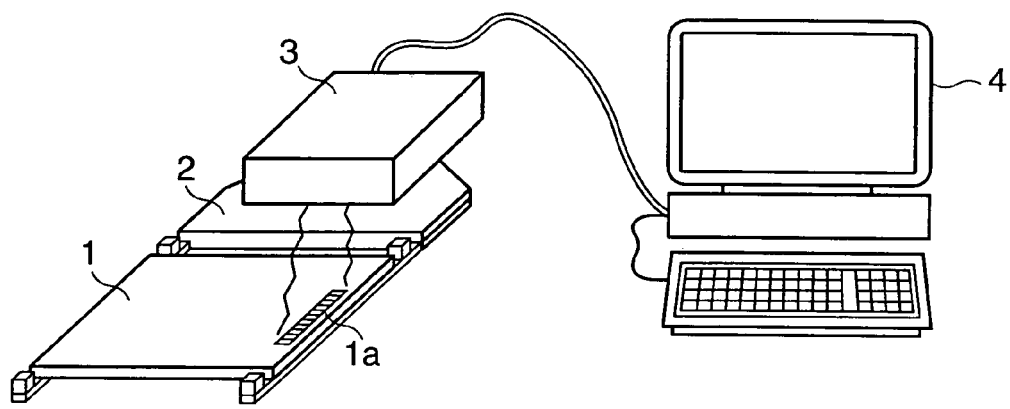
FIG. 1A is a schematic view showing a bar code reader in a reticle transfer apparatus based on the present invention.

FIG. 1A is a schematic view showing a bar code reader in the reticle transfer apparatus according to the first embodiment. FIG. 1B is a side view of the bar code reader in the reticle transfer apparatus based on the first embodiment. FIG. 1C is a plan view showing a transfer hand in a reticle held state in the reticle transfer apparatus based on the present invention.

Figure 1B:
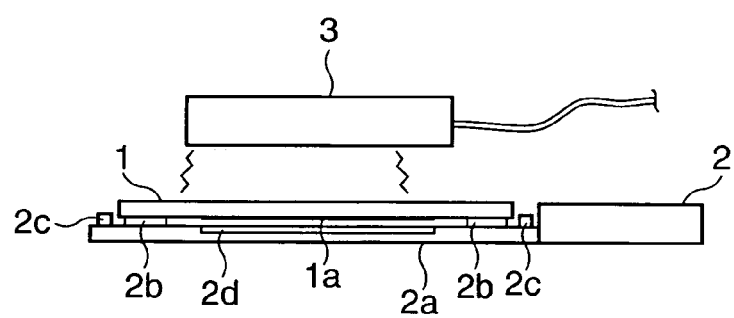
FIG. 1B is a side view of the bar code reader in the reticle transfer apparatus based on the present invention.
Figure 1C:
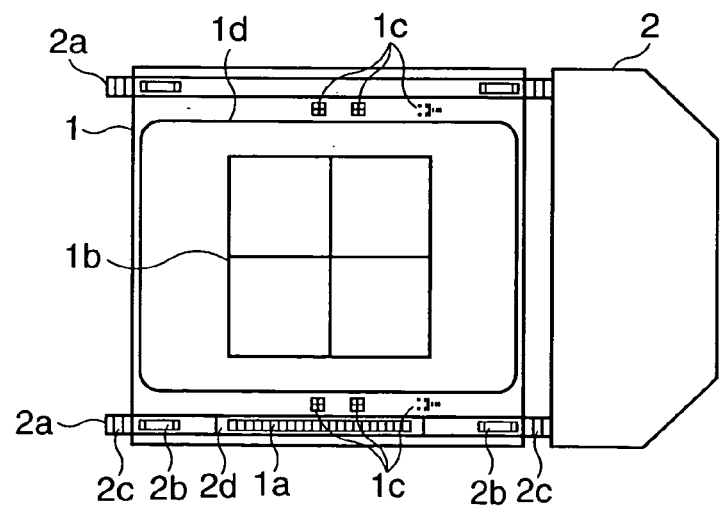
FIG. 1C is a plan view of a transfer hand holding a reticle in the reticle transfer apparatus based on the present invention, and particularly, showing the relationship between the reticle and the transfer hand.

Referring to FIGS. 1A to 1C, reference numeral 1 denotes a reticle formed of a transparent glass material. A bar code 1a serving as an information code about the exposure pattern and the like of the reticle, a pattern portion 1b used for semiconductor exposure, and alignment marks 1c used for various alignment operations in exposure are marked with chromium on the lower surface of the reticle 1. Reference numeral 1d denotes a pellicle frame for supporting a pellicle film formed at a position offset from the pattern surface so as to prevent direct attachment of foreign substances to the reticle pattern surface. Reference numeral 2 denotes a transfer hand in a transfer apparatus for extracting the reticle 1 from a reticle carrier (not shown in FIGS. 1A to 1C) and transferring it to the exposure apparatus main body (not shown in FIGS. 1A to 1C). The transfer hand 2 is horizontally and vertically movable by a driving mechanism (not shown). Suction pads 2b for chucking the reticle 1 by vacuum suction and stoppers 2c for preventing any positional shift of the reticle 1 are disposed on a pair of holding arms 2a of the transfer hand 2. A reflection portion 2d is formed on the lower surface of the transfer hand 2, which opposes the bar code 1a of the reticle 1 when the reticle 1 is chucked/held on the transfer hand 2.

Reference numeral 3 denotes a bar code reader incorporating an illumination portion for illuminating a reticle code and a detection portion for reading the reticle code. The bar code 1a read by the bar code reader 3 is converted into an electrical signal, which is sent to a terminal 4 and used as a reticle ID to set various parameters in exposure. The parameters are set by selecting a parameter file on the basis of the reticle ID. In this case, the parameter file may be transmitted online from a host computer (not shown) or a parameter file stored in the terminal 4 in advance may be used on the basis of the reticle ID.

The reading operation of the reticle bar code in the reticle transfer apparatus having the above arrangement will be described in detail below.

In transferring the reticle 1 by the transfer hand 2, the position of the reticle 1 is regulated by the stoppers 2c of the transfer hand 2, and the reticle 1 is chucked/held by the suction pads 2b. At this time, the bar code 1a of the reticle 1 vertically overlaps the reflection portion 2d formed on the transfer hand 2. When the reticle 1 is chucked/held on the transfer hand 2 and positioned below the bar code reader 3, the bar code reader 3 starts reading the reticle code. More specifically, illumination light from the illumination portion of the bar code reader 3 illuminates the bar code 1a. This illumination light is absorbed by an antireflection film made of chromium oxide or the like formed on the surfaces of bar portions of the bar code 1a made of chromium, while the illumination light passes through the space portions of the bar code 1a because the space portions are made of the transparent glass portions of the reticle 1 and is reflected by the reflecting portion 2d formed on the lower surface of the transfer hand 2. The reflected light passes through the space portions of the bar code 1a again and is projected onto the detection portion. The bar code pattern is detected and read by the code reader 3. The read pattern is converted into an electrical signal, which is sent to the terminal 4.

As the illumination light, cell projection using LEDs or scan projection using a semiconductor laser can be used. As the detection portion, a general CCD line sensor is used for a bar code. However, a two-dimensional CCD camera may be used to read a bar code together with a two-dimensional code.

As a member for the reflecting portion 2d, a mirror may be used, or the hand surface may be mirror-finished to directly reflect the illumination light. In this case, the position of the bar code reader must be strictly adjusted. For this reason, a white resin tape or white board may be bonded to generate scattered light, or corner cubes having a small pitch may be formed.

In FIG. 1B, the illumination portion and detection portion of the bar code reader 3 may be separated such that a code detection portion is arranged at the position of the reflecting portion 2d of the transfer hand 2, and the code illumination portion is arranged at the position of the bar code reader 3. The bar code can then be read in the transmission scheme as in the conventional case. Alternatively, an illumination portion such as an LED may be incorporated at the position of the reflecting portion 2d of the transfer hand 2, while only a detection portion is formed on the bar code reader 3 side. The bar code can then similarly be read in the transmission scheme.

Figure 2:
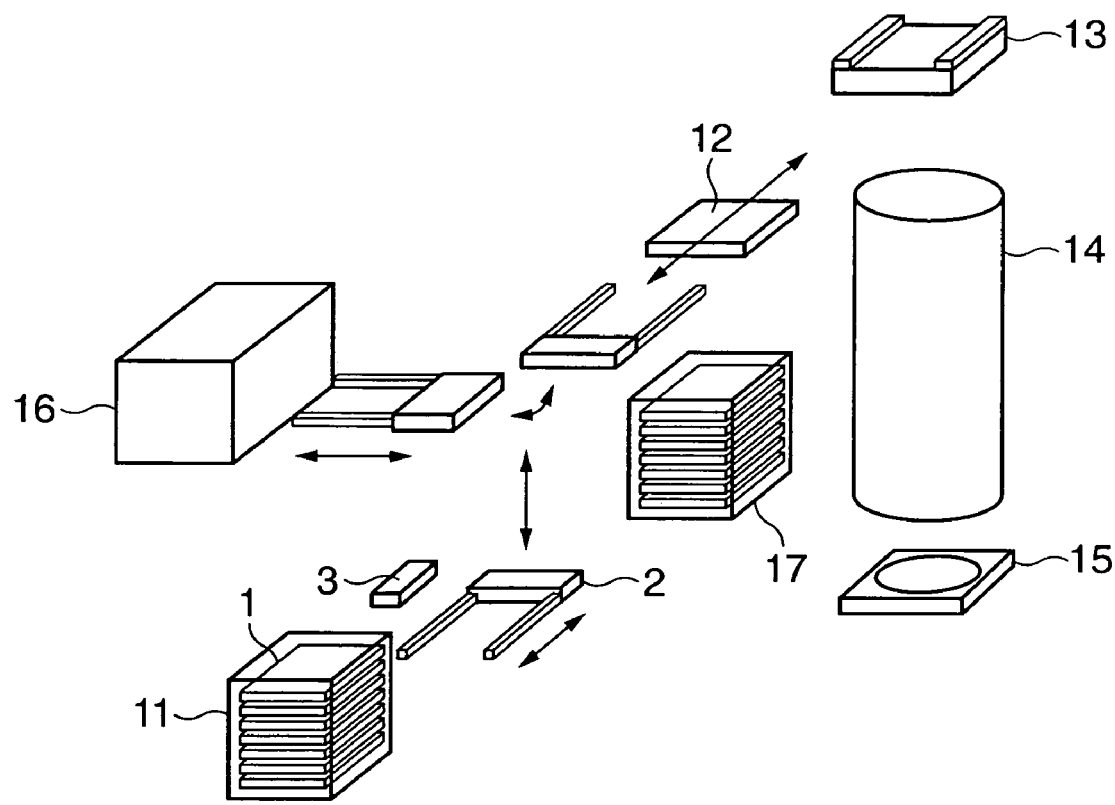
FIG. 2 is a schematic view showing a reticle flow in a SMIF semiconductor exposure apparatus.

The flow of a reticle in the SMIF semiconductor exposure apparatus incorporating the reticle transfer apparatus described above will be described with reference to FIG. 2. Note that FIG. 2 is a schematic view showing the flow of a reticle in the SMIF semiconductor exposure apparatus.

Figure 10:
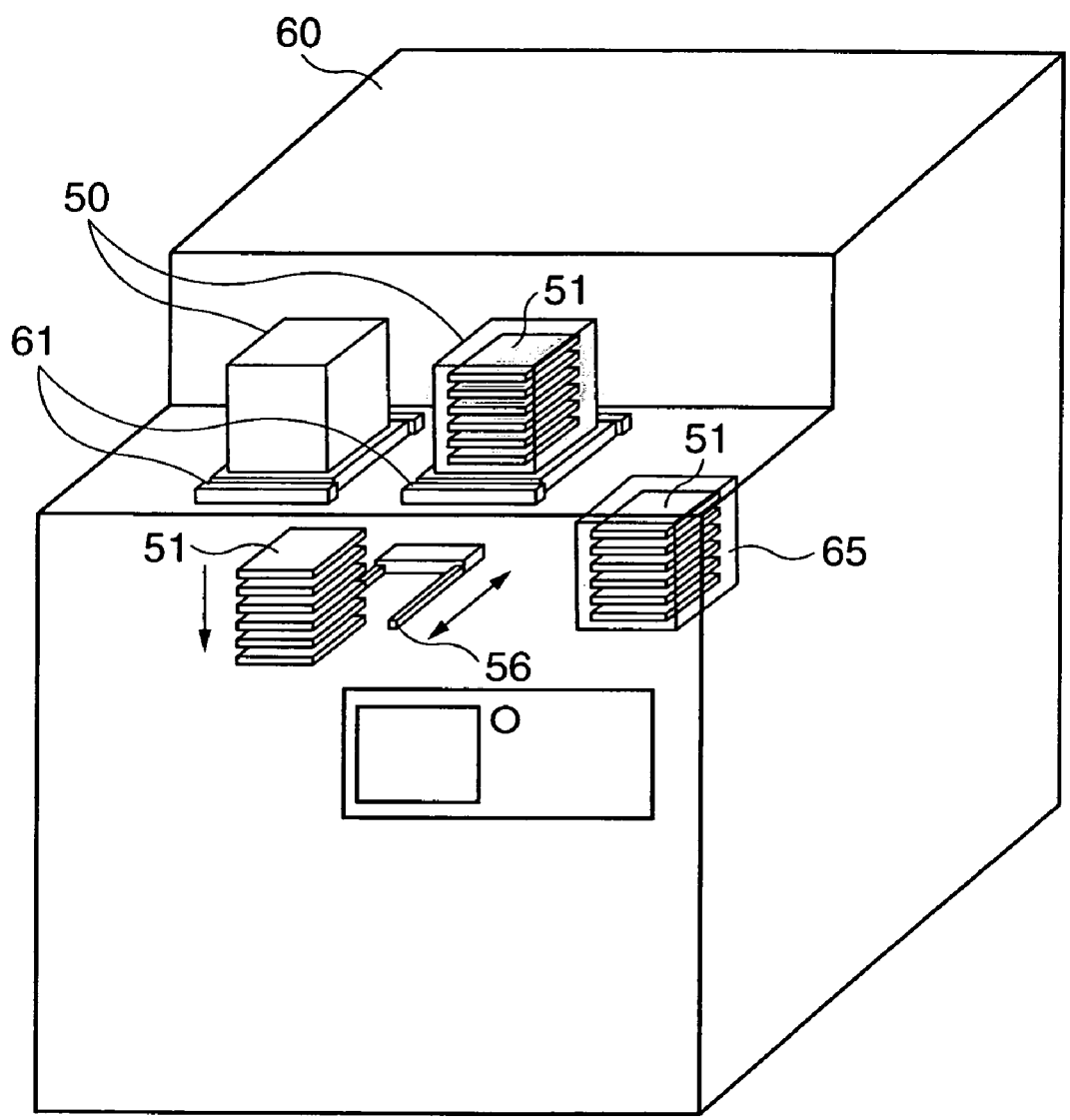
FIG. 10 is a schematic view showing a SMIF semiconductor exposure apparatus.
Figure 11A:
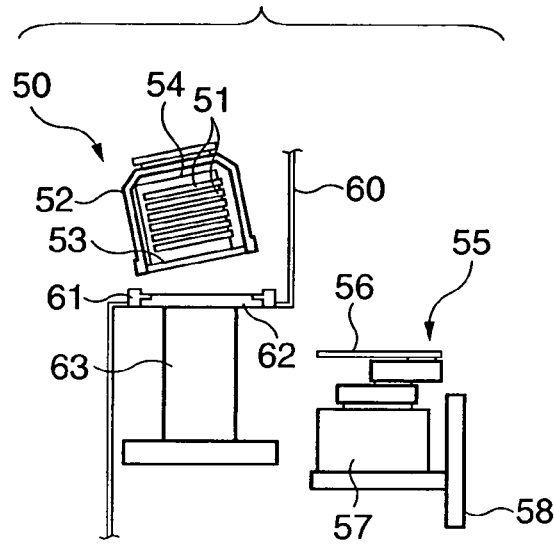
FIGS. 11A to 11D are views illustrating reticle transport states in the SMIF semiconductor exposure apparatus.
Figure 11B:
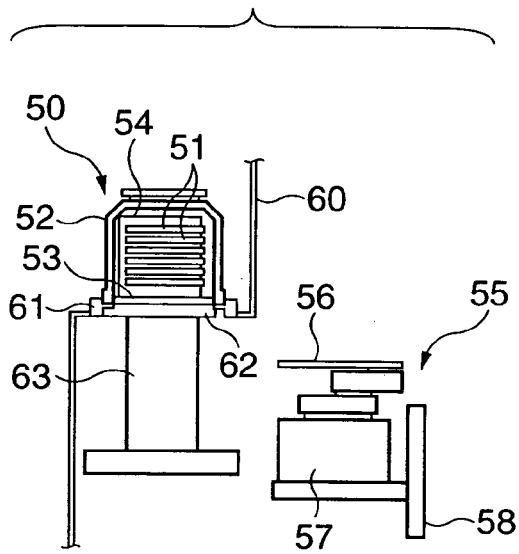
Figure 11C:
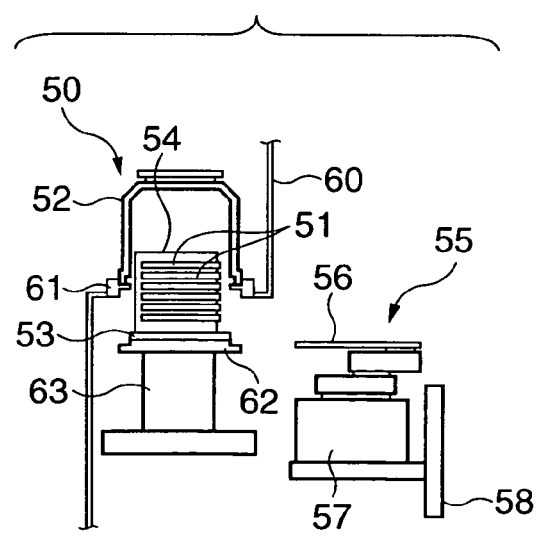
Figure 11D:
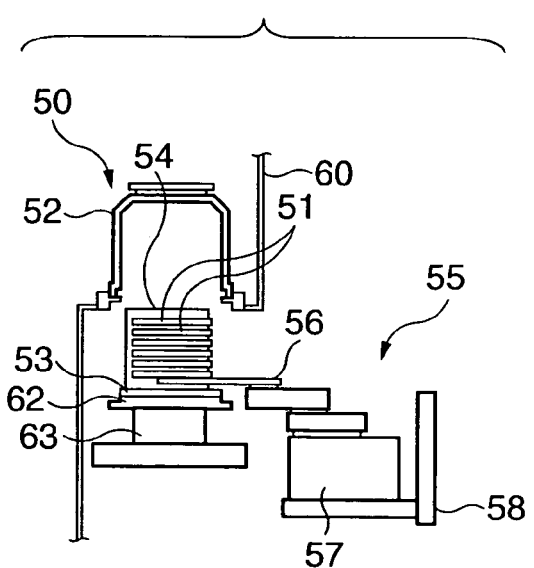
Figure 12A:
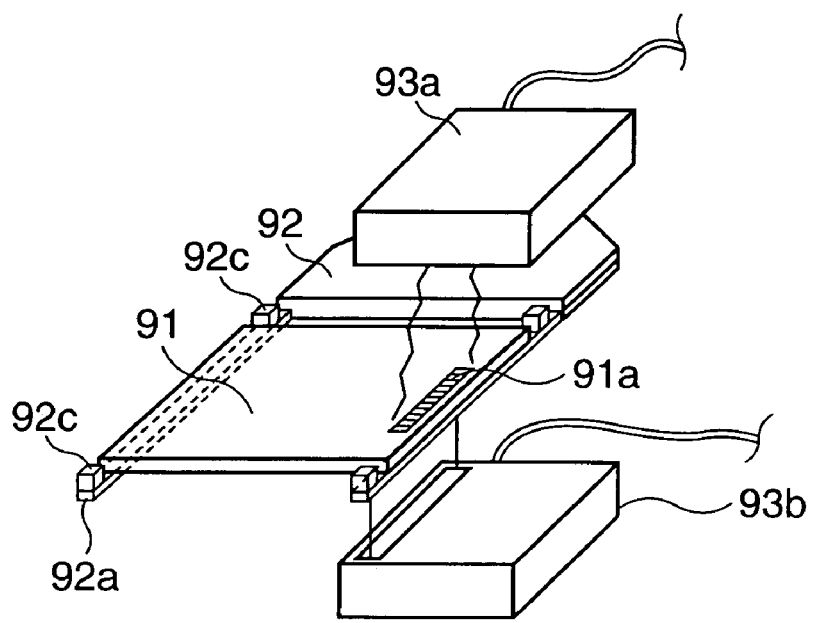
FIG. 12A is a schematic view showing a transmission bar code reader in a conventional reticle transfer apparatus.
Figure 12B:
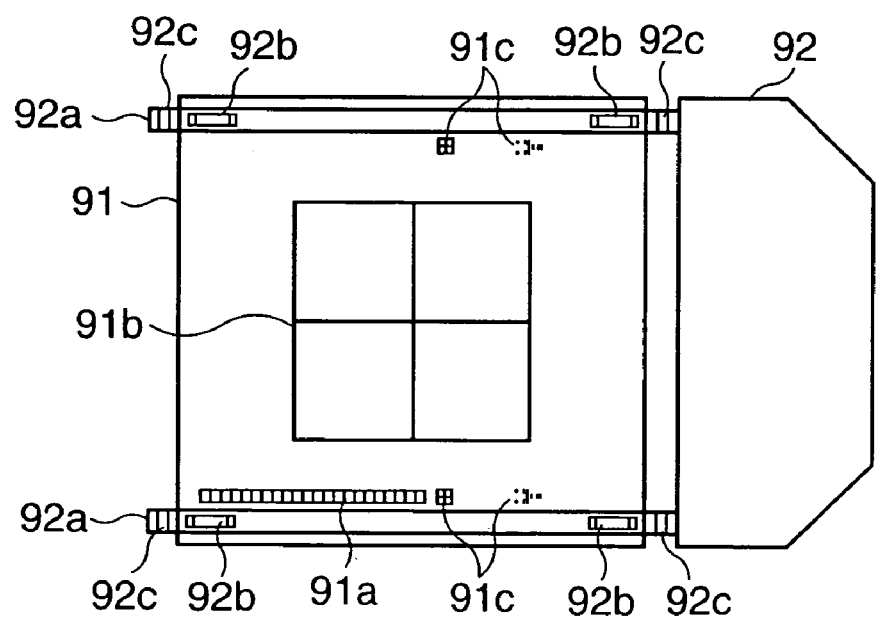
FIG. 12B is a plan view showing a transfer hand holding a reticle in the conventional reticle transfer hand apparatus and, particularly, showing the relationship between the reticle and the transfer hand.

The environment of the semiconductor exposure apparatus is separated from the environment outside the chamber in the clean room by the chamber, as shown in FIG. 10. The temperature, pressure, and cleanliness of the environment of the semiconductor exposure apparatus are managed. In the same manner as in FIGS. 11A to 11D, the reticles are set on a plurality of load ports disposed on the horizontal portion of the chamber while they are kept stored in a reticle carrier library. The reticles are extracted together with the reticle carrier library downward from the reticle SMIF pod on the load port and loaded into the chamber. The reticles are transferred by a reticle transfer unit for reticle loading/unloading.

The reticle 1 stored in the reticle carrier library 11 is chucked/held on the transfer hand 2 of the reticle transfer unit in the chamber and extracted from the reticle carrier library 11. The extracted reticle 1 is transferred to the semiconductor exposure apparatus. During the transfer, when the reticle 1 is located below the bar code reader 3, the bar code reader 3 reads the bar code 1a on the reticle 1 as described with reference to FIG. 1. The read information is converted into an electrical signal, which is sent to the terminal 4, thereby registering or checking the reticle ID. The reticle 1 is then aligned with a reticle stage 13 on a reticle alignment station 12 and fed to the reticle stage 13. The reticle 1 is then used for exposure. Reference numeral 14 denotes an exposure projection optical system; and 15, a wafer stage. Reference numeral 16 denotes a dust inspection device for inspecting dust on the reticle 1. The dust inspection device 16 inspects whether dust is attached to the reticle 1 during transfer of the reticle 1 to the reticle stage 12. Reference numeral 17 denotes a reticle library capable of storing a plurality of reticles. The reticle library 17 has a mechanism capable of managing the cleanliness of the stored reticles when the chamber is opened. The reticle library 17 is preferably disposed closer to the reticle stage 13. When the schedule of reticles to be used is known, reticles having undergone dust inspection are fed and stored in the reticle carrier library 17 in advance before they are fed to the reticle carrier library 11, thereby shortening the reticle exchange time and achieving efficient reticle management.

Second Embodiment

The second embodiment of the present invention will be described with reference to FIGS. 3A and 3B. According to the second embodiment shown in FIGS. 3A and 3B, a bar code reader for reading the bar code of a reticle is movable together with a reticle transfer unit for transferring the reticle. With this arrangement, a reticle can be extracted from a carrier and a bar code can immediately be read. The dedicated bar code reading position need not be determined, nor the reticle need be moved to the dedicated bar code reading position. The second embodiment is advantageous in reducing the space and shortening the transfer time.

Figure 3A:
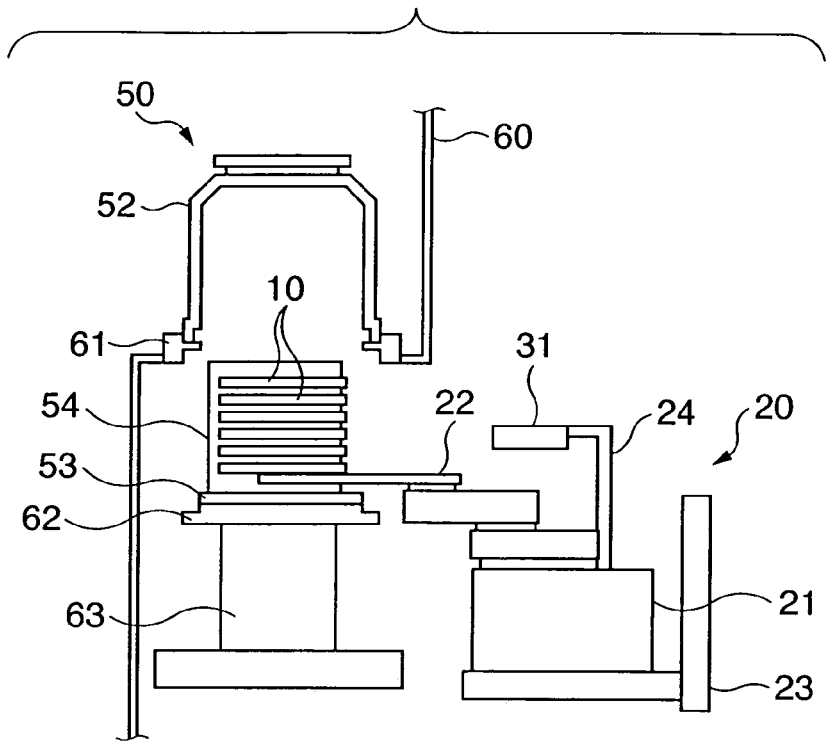
FIGS. 3A and 3B are schematic views showing another embodiment of a reticle transfer apparatus based on the present invention.
Figure 3B:
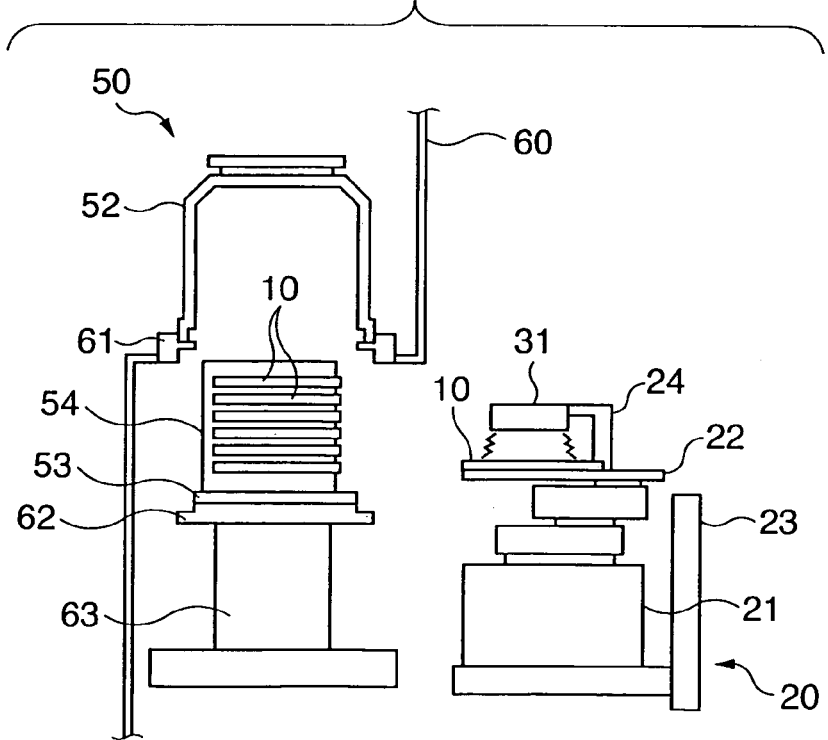

Referring to FIGS. 3A and 3B, reference numeral 20 denotes a transfer robot serving as a transfer unit for transferring a reticle. The transfer robot 20 is comprised of a scalar 3-joint robot main body (to be referred to simple as an Rθ robot hereinafter) 21 for performing biaxial driving, i.e., driving along the R-axis as the hand stretching direction and driving along the θ-axis, a transfer hand 22 for chucking/holding a reticle, and a Z-axis driving unit 23 for vertically driving the Rθ robot 21. Reference numeral 31 denotes a bar code reader for reading a bar code on a reticle 10. The bar code reader 31 is arranged on the Rθ robot 21 through a bracket 24 and is movable together with the Rθ robot 31. When the transfer hand 22 extracts the reticle 10 from a reticle carrier library 54, or the transfer hand 22 is completely folded, the Rθ robot 21 is located at a position where the bar code of the reticle 10 held on the transfer hand 22 can be read (in the embodiment shown in FIGS. 3A and 3B, the bar code of the reticle 10 can be read when the transfer hand 22 is completely folded). The reticle 10 and transfer hand 22 of the second embodiment have the same structures as those of the reticle 1 and transfer hand 2 described with reference to FIG. 1. The bar code of the reticle 10 is formed at a position where it overlaps a reflecting portion formed on the transfer hand 22 when the reticle 10 is chucked/held on the transfer hand 22. The structures of a reticle SMIF pod 50, the reticle carrier library 54, a load port 61, and an elevator mechanism 63 are the same as those shown in FIGS. 10 and 11A to 11D.

According to the second embodiment arranged as described above, as shown in FIG. 3A, the transfer hand 22 of the Rθ robot 21 extracts the reticle 10 from the reticle carrier library 54. As shown in FIG. 3B, when the transfer hand 22 is completely folded, the reticle 10 chucked/held on the transfer hand 22 can be positioned below the bar code reader 31. In this state, illumination light from an illumination portion in the bar code reader 31 illuminates the bar code on the reticle 10, and light reflected by the reflecting portion of the transfer hand 22 formed on the lower surface opposing the upper surface on which the reticle bar code is formed is reflected on the detection portion. The bar code pattern is detected and read. In this manner, according to this embodiment, when the reticle 10 is chucked/held on the transfer hand 22, and the transfer hand 22 is folded, the bar code of the reticle 10 can be read regardless of the position of the reticle. For this reason, the bar code can be read at the time when the reticle is to be extracted from the reticle carrier library 54 shown in FIG. 3, the reticle stored in the reticle library (17 in FIG. 2) in the chamber 60 in advance is to be loaded onto the reticle stage, or the exposed reticle is to be unloaded.

When all the reticle IDs of the reticles stored in the reticle carrier library or reticle library are to be checked, conventionally, a reticle is transferred to the code reading position and undergoes code reading, the reticle having undergone code reading is stored in the reticle carrier library or reticle library, and the next reticle is transferred to the code reading position. In this manner, conventionally, reticles must be transferred one by one, resulting in a long reading time. However, when this embodiment is applied, as shown in FIGS. 3A and 3B, the bar code can be read by only R-axis stretch/folding of the transfer hand 22 and vertical movement for exchanging the reticle without moving the transfer robot 20 from the front of the reticle carrier library 54. The codes of all the reticles 10 in the reticle container such as the reticle carrier library 54 can be quickly read. This is particularly effective to quickly check reticle codes when the apparatus stops due to some trouble and reticle information stored in the apparatus is lost.

In the second embodiment, as in the first embodiment, the illumination portion and detection portion of the bar code reader 31 may be separated such that a code detection portion is arranged at the position of the reflecting portion of the transfer hand 22, and the code illumination portion is arranged at the position of the bar code reader 31. The bar code can be read in the transmission scheme as in the conventional case. Alternatively, an illumination portion such as an LED may be incorporated at the position of the reflecting portion of the transfer hand 22, while only a detection portion is formed on the bar code reader 31 side. The bar code can similarly be read in the transmission scheme.

Third Embodiment

The third embodiment of the present invention will be described with reference to FIGS. 4A and 4B.

According to the third embodiment, when a code on a reticle is located not to vertically overlap the transfer hand of a transfer robot, as in the conventional case, a bar code reader is moved together with a reticle transfer unit.

Figure 4A:
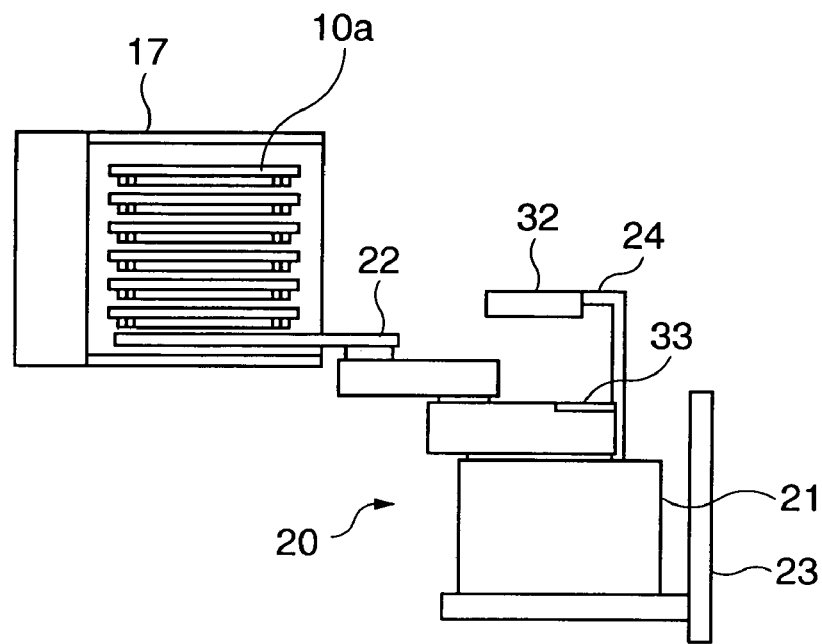
FIGS. 4A and 4B are schematic views showing still another embodiment of a reticle transfer apparatus based on the present invention.
Figure 4B:
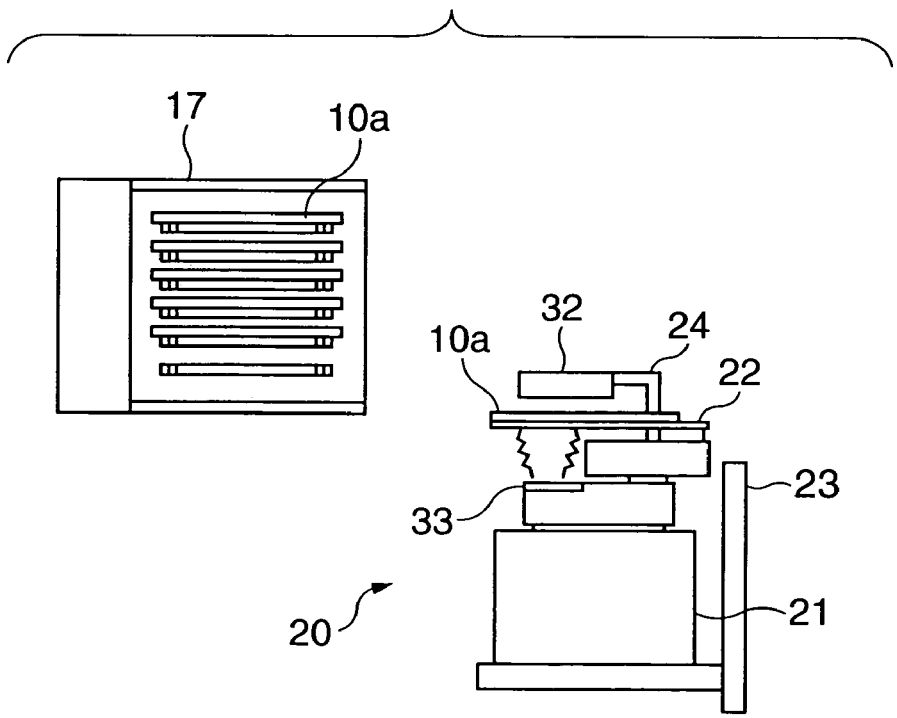

As shown in FIGS. 4A and 4B, a bar code reader detection portion 32 is set to be movable together with an Rθ robot 21 through a bracket 24, and an illumination portion 33 of an LCD or the like is arranged on the Rθ robot 21 so as to oppose the reticle bar code reader detection portion 32 via the reticle 10. The bar code can then be read in the transmission scheme as in the conventional case.

FIG. 4A shows a state in which a reticle 10a stored in a reticle library 17 arranged in a chamber is extracted by a transfer hand 22 of the Rθ robot 21. FIG. 4B shows a state in which a reticle chucked/held by the transfer hand 22 is positioned below the detection portion 32, a bar code (not shown) on the reticle 10a is illuminated with illumination light from the illumination portion 33 on the Rθ robot 21, and an detection portion 32 reads the bar code. With this arrangement, even when the code on the reticle 10a is located not to vertically overlap the transfer hand 22, unlike the conventional case, the reticle 10a is chucked/held on the transfer hand 22, and the bar code of the reticle 10a can be read regardless of the position of the bar code. The same effect as in the second embodiment described with reference to FIGS. 3A and 3B can be obtained.

In each embodiment described above, a bar code has been exemplified as a code. However, an OCR or a pattern analysis device may be used as a code detection portion to allow reading of a code made up of characters or an arbitrary pattern. The same effect as that described above can be obtained even if a two-dimensional code such as a Data Matrix or QR code, which has recently become popular, is read.

Fourth Embodiment

A production system for producing a semiconductor device (e.g., a semiconductor chip such as an IC, or LSI, a liquid crystal panel, a CCD, a thin-film magnetic head, a micromachine, or the like) using a semiconductor manufacturing apparatus incorporating the substrate transfer apparatus described above will be exemplified. A trouble remedy or periodic maintenance of a manufacturing apparatus installed in a semiconductor manufacturing factory, or maintenance service such as software distribution is performed by using a computer network outside the manufacturing factory.

FIG. 5 is a schematic view showing an overall system. In FIG. 5, reference numeral 101 denotes a business office of a vendor (e.g., an apparatus supply manufacturer), which provides a semiconductor device manufacturing apparatus. Assumed examples of the manufacturing apparatus are semiconductor manufacturing apparatus for performing various processes used in a semiconductor manufacturing factory, such as pre-process apparatuses (e.g., an exposure apparatus, a resist processing apparatus, an annealing apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to construct an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers of the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106. The factory can receive, from the vendor, response information (e.g., infromation designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated-line network (e.g., an ISDN) having high security, which inhibits access of a third party can be adopted. Also, the user may construct a database in addition to the one provided by the vendor and set the database on the external network, and host management system may authorize access to the database from a plurality of user factories.

Figure 6:
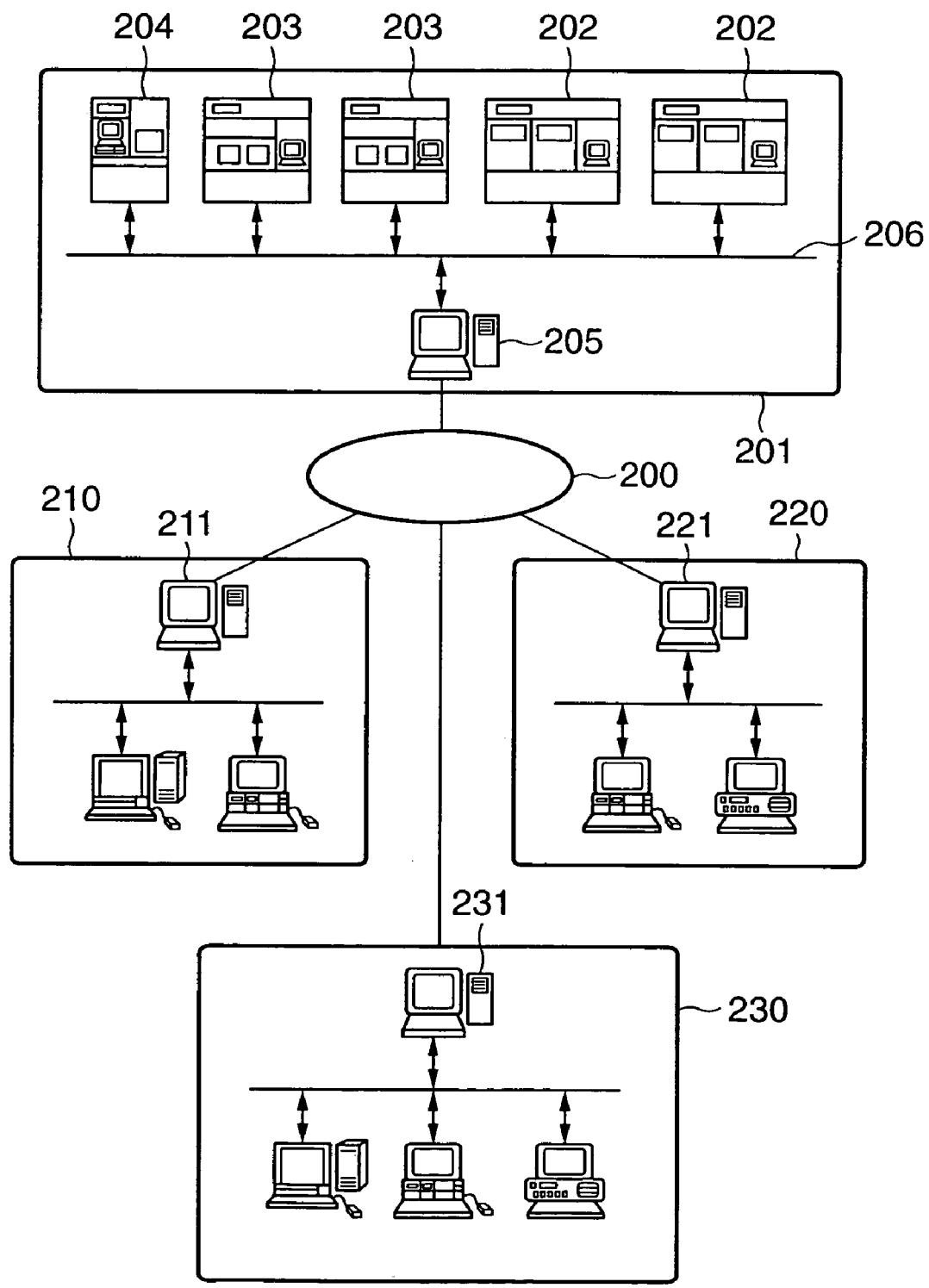
FIG. 6 is a schematic view showing another overall arrangement of a semiconductor device production system.

FIG. 6 is a view showing the concept of the overall system of this embodiment that is cut out at a different angle from FIG. 5. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 6, a factory having manufacturing apparatuses of a plurality of vendors, and the management systems of the vendors for these manufacturing apparatuses are connected via the external network of the factory, and maintenance information of each manufacturing apparatus is communicated. In FIG. 6, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 6 shows only one manufacturing factory 201, but a plurality of factories are networked in practice. The respective apparatuses in the factory are connected to a LAN 206 to construct an intranet, and a host management system 205 manages the operation of the manufacturing line. The business offices of vendors (e.g., apparatus supply manufacturers), such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If trouble occurs in any one of a series of manufacturing apparatuses along the manufacturing line in this system, the operation of the manufacturing line stops. This trouble can be quickly removed by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software, which are stored in a storage device. The storage is a built-in memory, a hard disk, or a network file server. The network access software includes a dedicated or general-purpose web browser, and provides a user interface having a window as shown in FIG. 7 on the display. While referring to this window, the operator who manages manufacturing apparatuses in each factory inputs, in input items on the windows, pieces of information such as the type of manufacturing apparatus (401), serial number (402), subject and occurrence date of trouble (403), degree of urgency of trouble (405), symptom (406), remedy (407), and progress (408). The pieces of input information are transmitted to the maintenance database via the Internet, and appropriate maintenance information is sent back from the maintenance database and displayed on the display. The user interface provided by the web browser realizes hyperlink functions (410 to 412), as shown in FIG. 7. This allows the operator to access detailed information of each item, to receive the latest-version software to be used for a manufacturing apparatus from a software library provided by a vendor, and to receive an operation guide (help information) as a reference for the operator in the factory.

The semiconductor manufacturing process using the above-described production system will be explained.

FIG. 8 shows the flow of th whole manufacturing process of the semiconductor device. In step 11 (circuit design), a semiconductor device circuit is designed. In step 12 (creation of exposure control data), exposure control data of the exposure apparatus is created based on the designed circuit pattern. In step 13 (wafer manufacture), a wafer is manufactured using a material such as silicon. In step 14 (wafer process) called a pre-process, an actual circuit is formed on the wafer. Step 15 (assembly), called a post-process, is the step of forming a semiconductor chip by using the wafer manufactured in step 14, and includes an assembly process (dicing and bonding) and a packaging process (chip encapsulation). In step 16 (inspection), inspection such as the operation confirmation test a durability test of the semiconductor device manufactured in step 15 are conducted. After these steps, the semiconductor device is completed and shipped (step 17). The pre-process and post-process are performed in separate dedicated factories and maintenance is done for each of the factories by the above-described remote maintenance system. Information for production management and apparatus maintenance is communicated between the pre-process factory and the post-process factory via the Internet or dedicated-line network.

Figure 9:
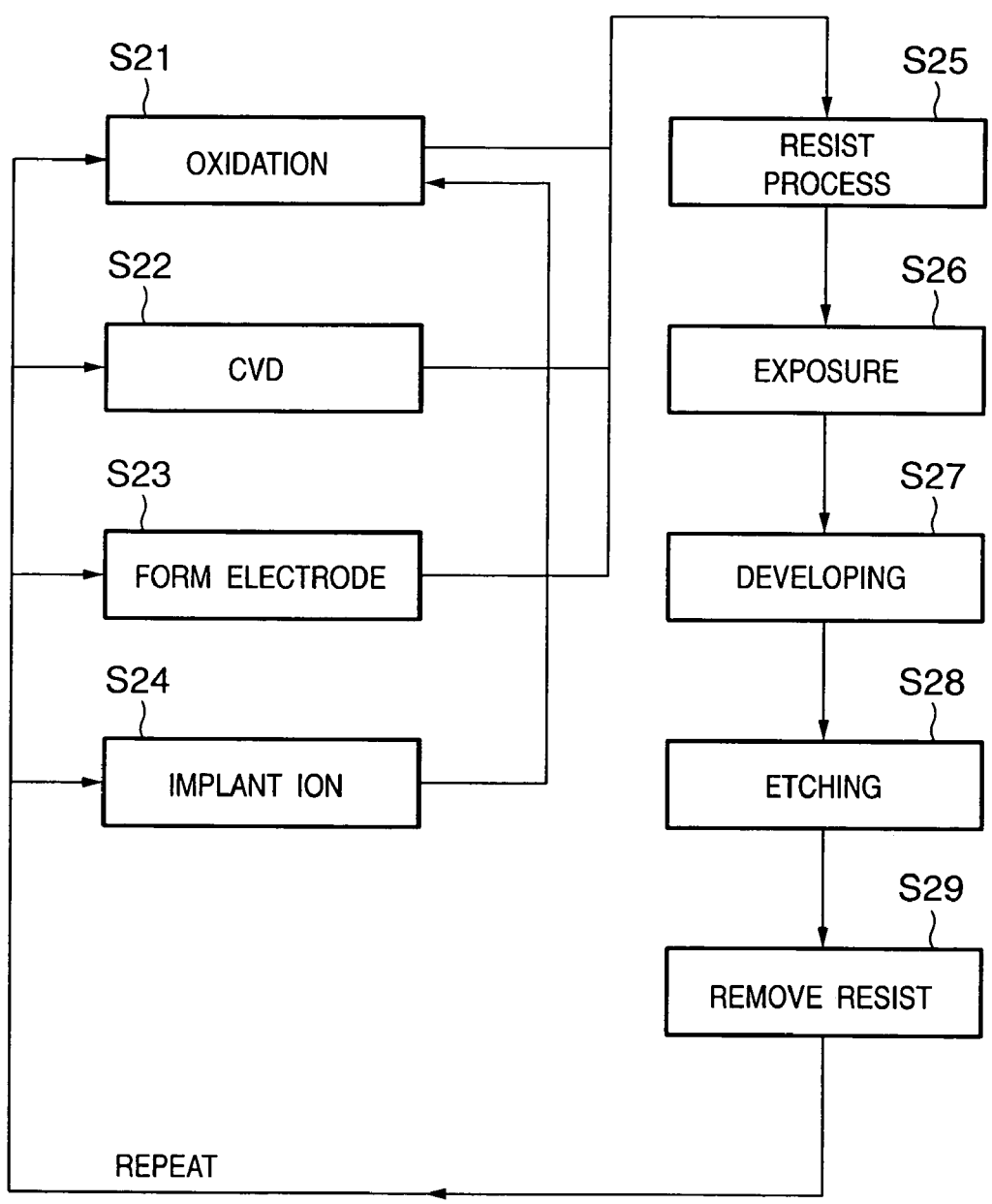
FIG. 9 is a flow chart showing a wafer process.

FIG. 9 shows the detailed flow of the wafer process. In step 21 (oxidation), the wafer surface is oxidized. In step 22 (CVD), an insulating film is formed on the wafer surface. In step 23 (electrode formation), an electrode is formed on the wafer by vapor deposition. In step 24 (ion implantation), ions are implanted in the wafer. In step 25 (resist processing), a photosensitive agent is applies to the wafer. In step 26 (exposure), the above-mentioned exposure apparatus bakes and exposes the circuit pattern of a mask on the wafer. In step 27 (developing), the exposed wafer is developed. In step 28 (etching), the resist is etched except for the developed resist image. In step 29 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, according to the present invention, on a transparent substrate such as a reticle or wafer, a code about substrate information can be located at a portion vertically overlapping the transfer hand, unlike the conventional case. The degree of freedom in code location with respect to interference with an alignment mark increases, and the capacity of the substrate information code increases accordingly. Therefore, the degree of freedom in management and operation of substrates such as reticles advantageously increases.

The code reader is movable together with a transfer unit, and the code on the substrate can be read while the substrate is stored or being transferred regardless of the code position. A flexible, highly reliable substrate transfer system having a high degree of freedom can be implemented.

According to the present invention, in manufacturing a semiconductor device, the reliability and efficiency of the management and a transfer system of substrates such as reticles or wafers and a cassette or carrier which stores them can be improved to contribute to automation in the semiconductor manufacture and improvement of productivity.

As many apparently widely different embodiments of the present invention can be made without departing from the spirit and scope thereof, it is to be understood that the invention is not limited to the specific embodiments thereof except as defined in the appended claims.

What is claimed is:

1. An apparatus for manufacturing a device using a substrate, said apparatus comprising:
    a container configured to contain the substrate;
    a process station configured to perform a process for the substrate;
    a transfer robot having a holding member for holding the substrate and a driving unit for driving said holding member, and configured to perform a transfer process that includes extracting the substrate out of said container and transferring the extracted substrate to said process station; and
    a reader configured to optically read a code formed on the substrate, of which information is to be used for manufacturing the device, in the transfer process performed by said transfer robot,
    wherein said holding member includes, as a part of said reader, one of a light reflecting portion for reflecting light passed through the code on the substrate held by said holding member, a light scattering portion for scattering light passed through the code on the substrate held by said holding member, a code detecting portion for detecting the code on the substrate held by said holding member, and a code illumination portion for illuminating the code on the substrate held by said holding member.

2. An apparatus according to claim 1, wherein the code includes a bar code.

3. An apparatus according to claim 1, wherein the substrate includes a transparent portion in which the code is formed.

4. An exposure apparatus for performing exposure of a first substrate to a pattern from a second substrate, said apparatus comprising:

a container configured to contain an object, the object being one of the first and second substrates;

a process station configured to perform a process for the object;

a transfer robot having a holding member for holding the object and a driving unit for driving said holding member, and configured to perform a transfer process that includes extracting the object out of said container and transferring the extracted object to said process station; and a reader configured to optically read a code formed on the object, of which information is to be used for the exposure, in the transfer process performed by said transfer robot, wherein said holding member includes, as a part of said reader, one of a light reflecting portion for reflecting light passed through the code on the substrate held by said holding member, a light scattering portion for scattering light passed through the code on the substrate held by said holding member, a code detecting portion for detecting the code on the substrate held by said holding member, and a code illumination portion for illuminating the code on the substrate held by said holding member.

5. An apparatus according to claim 4, wherein the code includes a bar code.

6. An apparatus according to claim 4, wherein the substrate includes a transparent portion in which the code is formed.

* * * * *

UNITED STATES PATENT AND TRADEMARK OFFICE
CERTIFICATE OF CORRECTION

PATENT NO. : 7,147,166 B2 Page 1 of 1
APPLICATION NO. : 09/920752
DATED : December 12, 2006
INVENTOR(S) : Ken Matsumoto It is certified that error appears in the above-identified patent and that said Letters Patent is hereby corrected as shown below:

COLUMN 7:
    Line 39, "simple" should read -- simply --.

COLUMN 9:
    Line 58, "of" should read -- or --.

COLUMN 10:
    Line 11, "infromation" should read -- information --.

COLUMN 11:
    Line 60, "applies" should read -- applied --.

Signed and Sealed this

Tenth Day of April, 2007

JON W. DUDAS
*Director of the United States Patent and Trademark Office*